United States Patent [19]
Kitaguchi et al.

[11] Patent Number: 5,568,074
[45] Date of Patent: Oct. 22, 1996

[54] VOLTAGE MONITORING CIRCUIT

[75] Inventors: Kouichi Kitaguchi; Yoshihide Okumura, both of Itami, Japan

[73] Assignees: Kanebo, Ltd.; Mitsubishi Denki Kabushiki Kaisha, both of Tokyo, Japan

[21] Appl. No.: 309,899

[22] Filed: Sep. 20, 1994

[30] Foreign Application Priority Data

Oct. 8, 1993 [JP] Japan .................... 5-252880

[51] Int. Cl.$^6$ .............. H03K 5/22; H03K 17/04
[52] U.S. Cl. .............. 327/77; 327/89; 327/374; 327/411
[58] Field of Search .............. 327/407–413, 327/77, 74, 82, 89, 403–405, 560–563, 374

[56] References Cited

U.S. PATENT DOCUMENTS

| | | | |
|---|---|---|---|
| 4,943,738 | 7/1990 | Hoshi | 327/89 |
| 5,247,210 | 9/1993 | Swanson | 327/77 |
| 5,285,115 | 2/1994 | Tsuji | 327/77 |
| 5,338,980 | 8/1994 | Ovens | 327/374 |
| 5,352,987 | 10/1994 | Harvey | 327/411 |
| 5,485,292 | 1/1996 | Wong et al. | 327/77 |

*Primary Examiner*—Toan Tran
*Attorney, Agent, or Firm*—Oblon, Spivak, McClelland, Maier & Neustadt, P.C.

[57] ABSTRACT

The positive input terminal (1), the negative input terminal (2) and the differential amplifier (10) are connected to the voltage converting circuit (9a). The differential amplifier (10) is composed of the operational amplifier (6) and the resistors (5a, 5b, 5c and 5d). The voltage converting circuit (9a) includes NPN transistors (91, 92 and 93). The base of the transistor (91) is connected to the positive input terminal (1) and the base of the transistor (92) is connected to the reference potential input end (3) to which the reference potential ($V_x$) is applied, respectively. The collectors of the transistors (91 and 92) are connected to the potential point (81) in common and the emitters are connected to the other end of the resistor (5a). The base of the transistor (93) is connected to the negative input terminal (2), the collector is connected to the potential point (81) and the emitter is connected to the other end of the resistor (5c). It is prevented that the voltage applied to the differential amplifier (10) considerably differs from the desired value ($V\phi$). The delay time of the output potential for a sharp change in the input voltage is shortened.

11 Claims, 12 Drawing Sheets

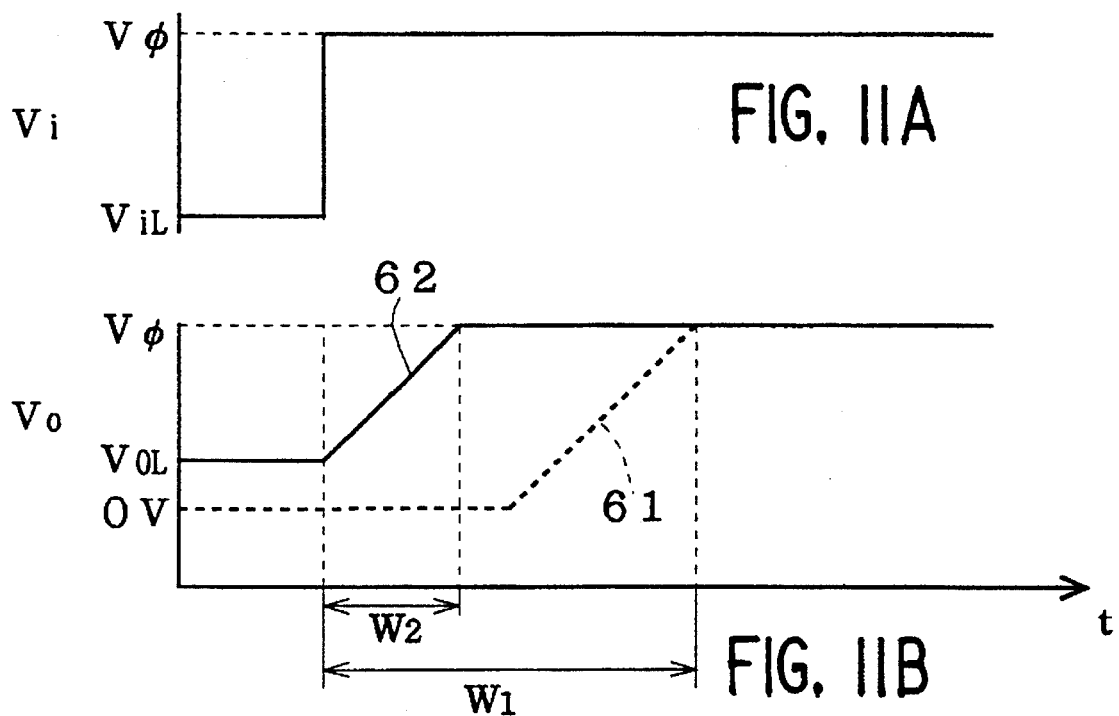

VOLTAGE MONITORING CIRCUIT

BACKGROUND OF THE INVENTION

1. Field of the Invention

The present invention relates to a voltage monitoring circuit for generating a difference between two input potentials as an output voltage.

2. Description of the Background Art

FIG. 10 is a circuit diagram showing the structure of a conventional voltage monitoring circuit 200. An input voltage $V_i$ is applied between a positive input terminal 1 and a negative input terminal 2. An output potential $V_o$ is applied to an output terminal 4. An operational amplifier 6 and resistors 5a, 5b, 5c and 5d form a differential amplifier, where the magnitude of the output potential $V_o$ can be made equal to the magnitude of the input voltage $V_i$ by making the values of all the resistances equal and making the gain of the operational amplifier 6 large enough. That is to say, the circuit 200 can monitor the voltage.

Now, assuming that the input voltage $V_i$ which is an object of monitoring changes to a desired value of a certain voltage $V\phi$, the description will be made. FIG. 11 is a graph which shows the change in the output potential $V_o$ when the input voltage $V_i$ makes transition from a value $V_{iL}$ which is lower than the desired value $V\phi$ to the desired value $V\phi$. In the graph, the curves 61 and 62 correspond to the changes of the output potential $V_o$ when the value $V_{iL}$ is equal to 0 v and when it is larger than 0 v, respectively.

The output potential $V_o$ reaches the desired value $V\phi$ when a certain delay time has passed after a sharp change of the input voltage $V_i$. When the input voltage $V_i$ rises from a value $V_{oL}$ larger than 0 v (the curve 62), the delay time $W_2$ is almost determined by the through rate of the operational amplifier 6 included in the circuit 200. When the input voltage $V_i$ rises from 0 v (the curve 61), the time required for the activation of the operational amplifier 6 is added and the delay time $W_1$ becomes further longer.

On the other hand, FIG. 12 is a graph showing the change of the output potential $V_o$ when the input voltage $V_i$ changes to the desired value $V\phi$ from a value $V_{iH}$ which is higher than the desired value $V\phi$. The output potential $V_o$ reaches the desired value $V\phi$ when the delay time $W_3$ has passed after the sharp change of the input potential $V_i$.

These delay times are wasteful times when the change of the input voltage $V_i$ is not reflected to the output potential $V_o$, which has a problem of deteriorating the performance as a voltage monitoring circuit. Accordingly it is desirable to shorten the delay time, but it is not easy to improve the through rate of the operational amplifier 6 while one of the causes of the delay time is the through rate of the operational amplifier included in the circuit 200.

SUMMARY OF THE INVENTION

According to the present invention, a voltage monitoring circuit comprises: (a) a first and a second input terminals between which an input voltage which changes to a desired value is applied and an output terminal; (b) a differential amplifier having an output end connected to the output terminal and a first and a second input ends, and (c) voltage converting means having, (c-1) a first and a second input ends respectively connected to the first and second input terminals for receiving a first and a second potentials, (c-2) a reference potential input end to which a reference potential set in the vicinity of the desired value is applied, and (c-3) a first and a second output ends connected to the first and second input ends of the differential amplifier, respectively, for applying the input voltage between the first output end and the second output end when the input voltage is closer to the desired value than the reference potential, and applying a potential difference between the reference potential and the second potential between the first output end and the second output end when the input voltage is farther from the desired value than the reference potential, wherein a result of monitoring a change in the input voltage is provided to the output terminal.

Preferably, the differential amplifier comprises; (b-1) an operational amplifier having an output end connected to the output terminal, a positive input end, and a negative input end, (b-2) a first resistor connected between the first input end of the differential amplifier and the positive input end of the operational amplifier, (b-3) a second resistor connected between the second input end of the differential amplifier and the negative input end of the operational amplifier, (b-4) a third resistor connected between the positive input end of the operational amplifier and the output end, (b-5) a fourth resistor for connecting the negative input end and the output end of the operational amplifier.

Preferably, values of the first through fourth resistors are equal to one another.

Preferably, the reference potential is lower than the desired value.

Preferably, the reference potential is higher than the desired value.

Preferably, the voltage converting means further comprises; (c-4) a first converting portion for level shifting either one of the first potential and the reference potential by a predetermined amount and applying it to the first output end, and (c-5) a second converting portion for level sifting the second potential by the predetermined amount and applying it to the second output end.

Preferably, the first converting portion comprises; (c-4-1) a first transistor having a control electrode to which the first potential is applied, a first current electrode connected to predetermined potential and a second current electrode connected to the first output end of the converting means, and (c-4-2) a second transistor having a control electrode to which the reference potential is applied, a first current electrode connected to the predetermined potential and a second current electrode connected to the first output end of the converting means.

Preferably, the second converting portion further comprises; (c-5-1) a third transistor having a control electrode to which the second potential is applied, a first current electrode connected to the predetermined potential and a second current electrode connected to the second output end of the converting means.

Preferably, the reference potential is lower than the desired value, and the first through third transistors are all NPN-type bipolar transistors.

Preferably, the reference potential is higher than the desired value, and the first through third transistors are all PNP-type bipolar transistors.

Preferably, the impedance converting means is further provided between the voltage converting means and the differential amplifier.

According to the present invention, the voltage converting means compares the input voltage, and the potential difference between the reference potential and the second potential in magnitude and applies one closer to the desired value to the differential amplifier. Therefore, it is avoided to apply an voltage which is considerably far from the desired value to the differential amplifier.

Specifically, when the reference potential is lower than the desired value, the delay time when the input voltage approaches the desired value from a value lower than the desired value is shortened. When the reference potential is higher than the desired value, the delay time when the input voltage approaches the desired value from a value higher than the desired value is shortened.

As the level shift amount of the first converting portion and the level shift amount of the second converting portion are equal in the voltage converting means, when the input voltage becomes closer to the desired value than the reference potential, the voltage which the voltage converting means applies to the differential amplifier is equal to the input voltage, where the output of the voltage monitoring circuit correctly reflects the input voltage.

According to the voltage monitoring circuit of the present invention, the delay time of output for a sharp change in the input voltage can be shortened.

Accordingly, it is an object of the present invention to provide a voltage monitoring circuit which can shorten the delay time without improving the through rate of the operational amplifier.

These and other objects, features, aspects and advantages of the present invention will become more apparent from the following detailed description of the present invention when taken in conjunction with the accompanying drawings.

BRIEF DESCRIPTION OF THE DRAWINGS

FIG. 11 is a graph for illustrating the conventional art.

DESCRIPTION OF THE PREFERRED EMBODIMENTS

A. Example to Which the Invention is Applied:

Before starting a detailed description of each embodiment, an example to which the present invention is applied will be shown to facilitate the understanding of the embodiments.

Figure 1:
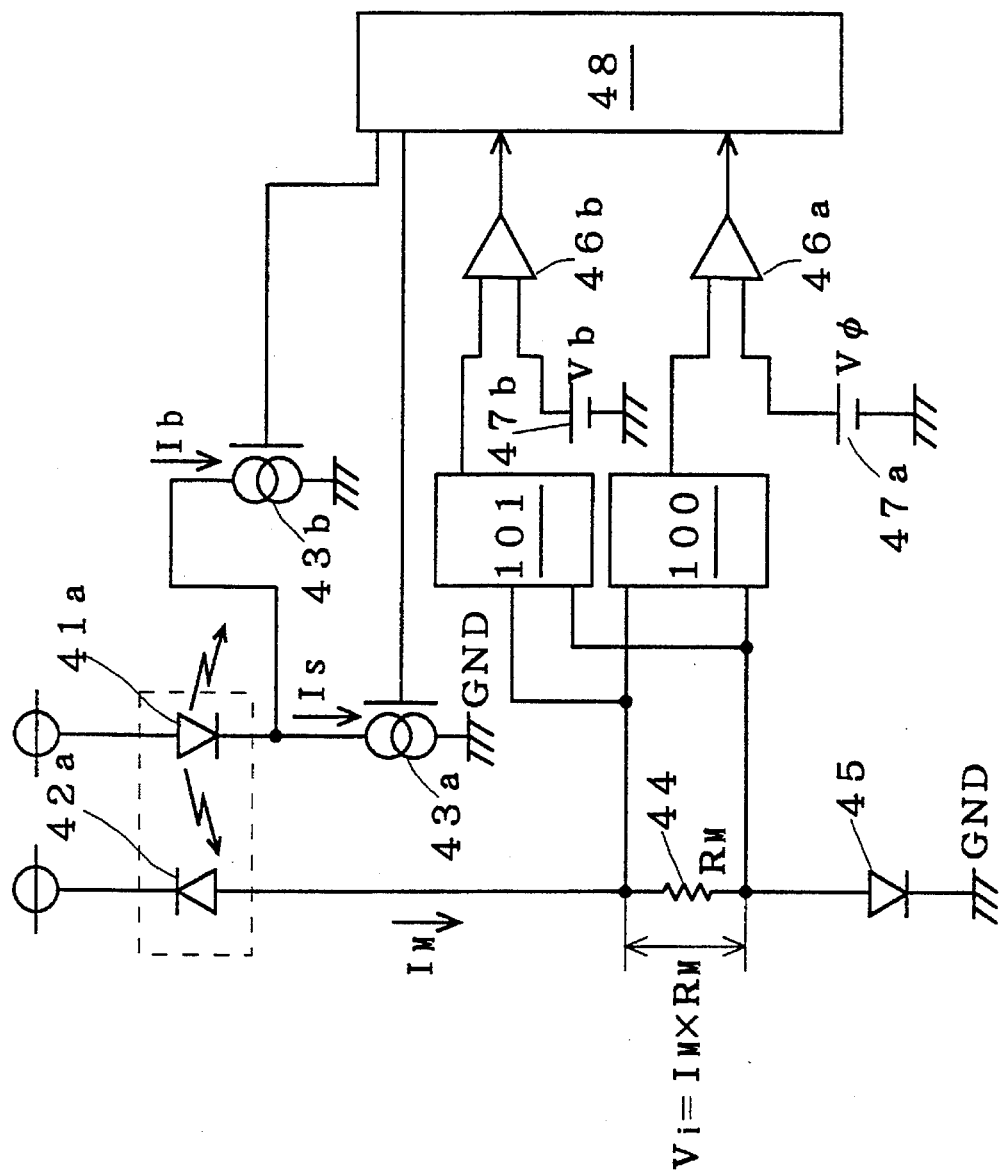
FIGS. 1 and 2 are circuit diagrams for illustrating the art to which the present invention is applied.
Figure 2:
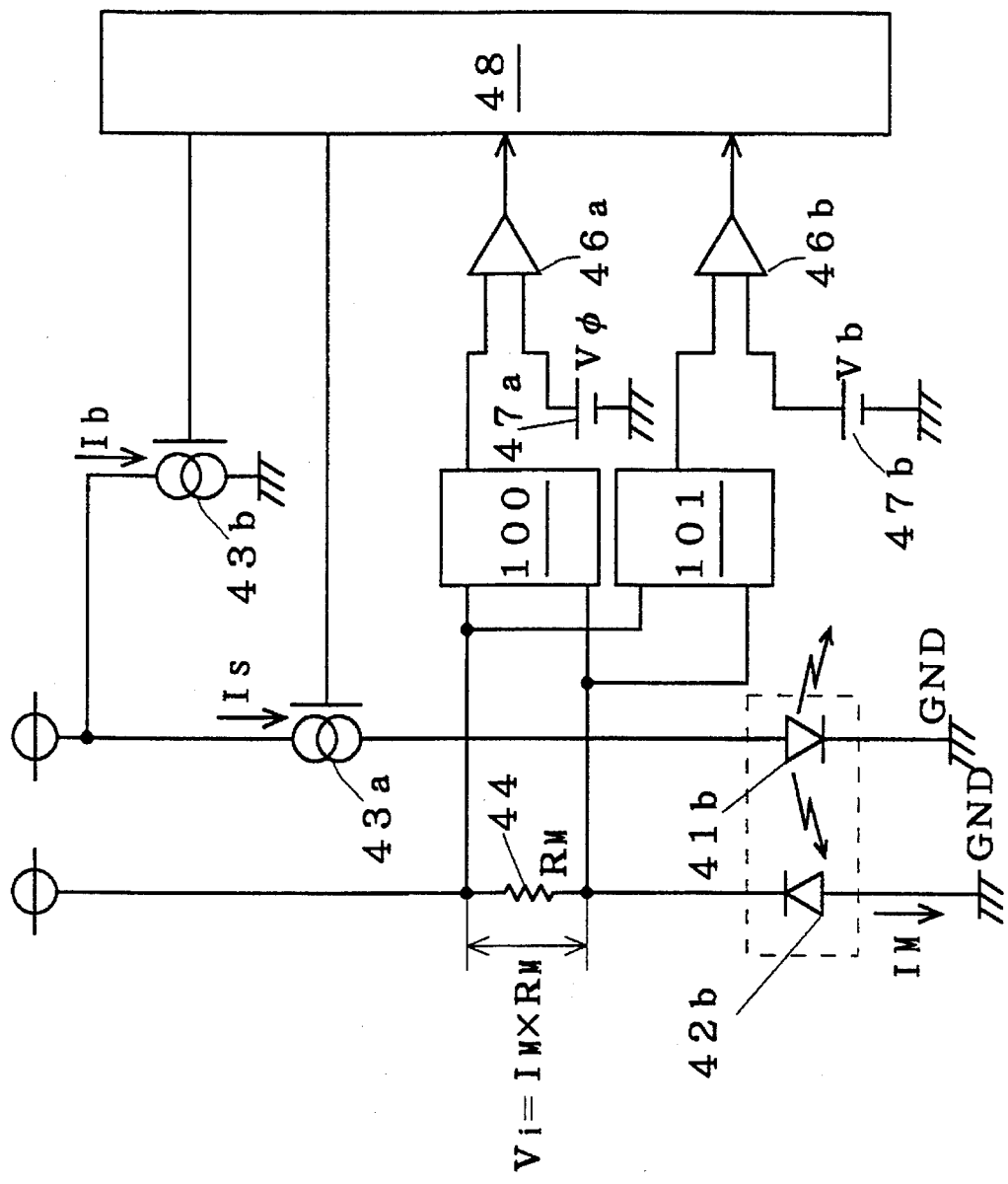

FIGS. 1 and 2 are circuit diagrams showing structures of an APC (Automatic Power Control) to which a voltage monitoring circuit 100, 101 according to the present invention is applied. FIG. 1 shows a structure in which a source type laser diode 41a is applied, and FIG. 2 shows a structure in which a sink type laser diode 41b is applied.

In the APCs shown in FIGS. 1 and 2, the laser diodes 41a and 41b to be controlled are each provided with bias current $I_b$ available from a controllable current source 43b. In addition, switching current $I_s$ which is larger than the bias current $I_b$ is supplied to the laser diodes 41a and 41b in some cases but is not supplied to the laser diodes 41a and 41b in some other cases. This switching current $I_s$ is available from a controllable current source 43a. Provided with the bias current $I_b$, the laser diodes 41a and 41b emit at a low luminous power. When provided with the switching current $I_s$ in addition to the bias current $I_b$, the laser diodes 41a and 41b emit at a high luminous power.

Luminescence amount emitted by the laser diodes 41a and 41b is converted into current $I_M$ by photodiodes 42a and 42b. The current $I_M$ is then converted into a voltage $V_i$ ($=I_M \times R_M$) by a resistor 44 having a resistance value of $R_M$ to be thereafter detected.

The voltage monitoring circuit 100 receives the voltage $V_i$ as an input voltage thereto, monitors a variation in the voltage $V_i$, and supplies the variation to a comparator 46a. The comparator 46a compares an output of the voltage monitoring circuit 100 and a desired potential $V\phi$ supplied from a voltage source 47a, and supplies a result of the comparison to a control device 48. In accordance with the result of the comparison, the control device 48 controls the current $I_s$.

A voltage monitoring circuit 101 as well receives the voltage $V_i$ as an input voltage thereto, monitors a variation in the voltage $V_i$, and supplies the variation to a comparator 46b. The comparator 46b compares an output of the voltage monitoring circuit 101 and a desired potential Vb supplied from a voltage source 47b, and supplies a result of the comparison to a control device 48. In accordance with the result of the comparison, the control device 48 controls the current $I_b$.

A diode 45 supplies a bias voltage to the input of the voltage monitoring circuit 100 in order to improve the characteristics of the voltage monitoring circuit 100.

Figure 3:
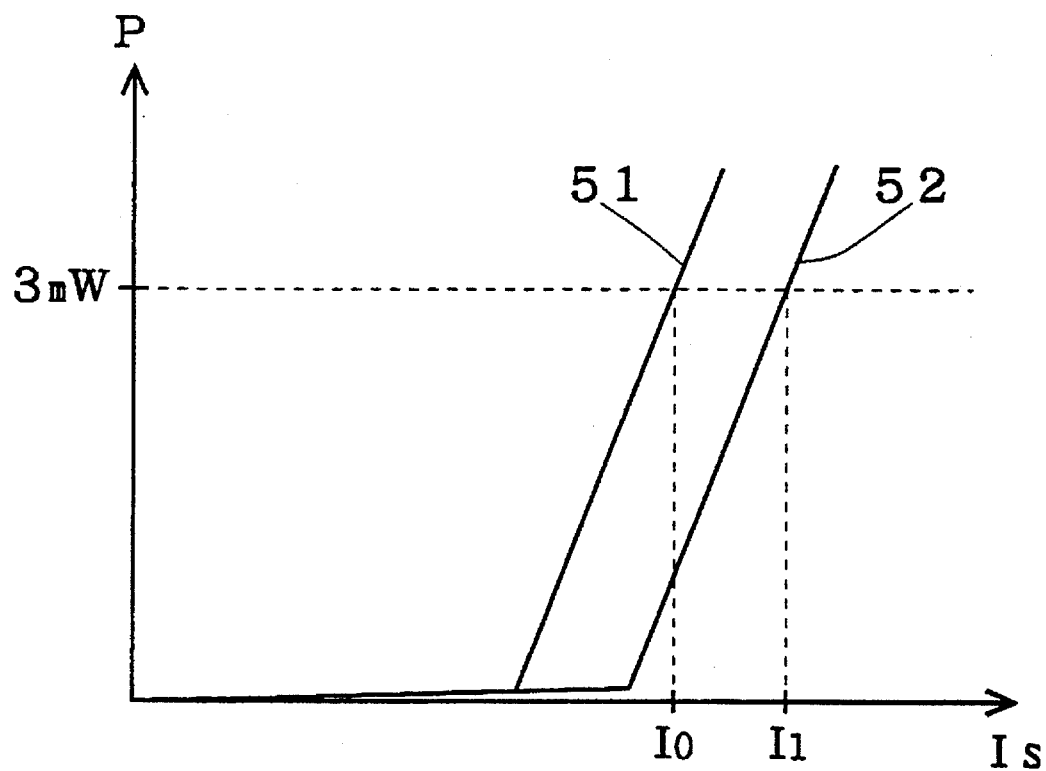
FIG. 3 is a graph for illustrating the art to which the present invention is applied.

FIG. 3 is a graph for illustrating an example of the relation between the magnitude of the current $I_s$ supplied to the laser diode 41a (or 41b) and the luminous power P. The curves 51 and 52 show the case with the ambient temperature of 25° C. and 75° C., respectively. If steady luminous power is required for the laser diode 41a (or 41b), the effect of the ambient temperature is important because the luminous power P largely changes according to the ambient temperature even if the magnitude of the current $I_s$ is constant. If the magnitudes of the current $I_s$ which is required for obtaining the luminous power of 3 mW when the ambient temperature is 25° C. and 75° C. are represented by $I_0$ and $I_1$, the value $I_1$ is considerably larger than the value $I_0$. In other words, the luminous power P which changes sensitively to the ambient temperature can not be constant if the magnitude of the current $I_s$ is constant.

Figure 4:
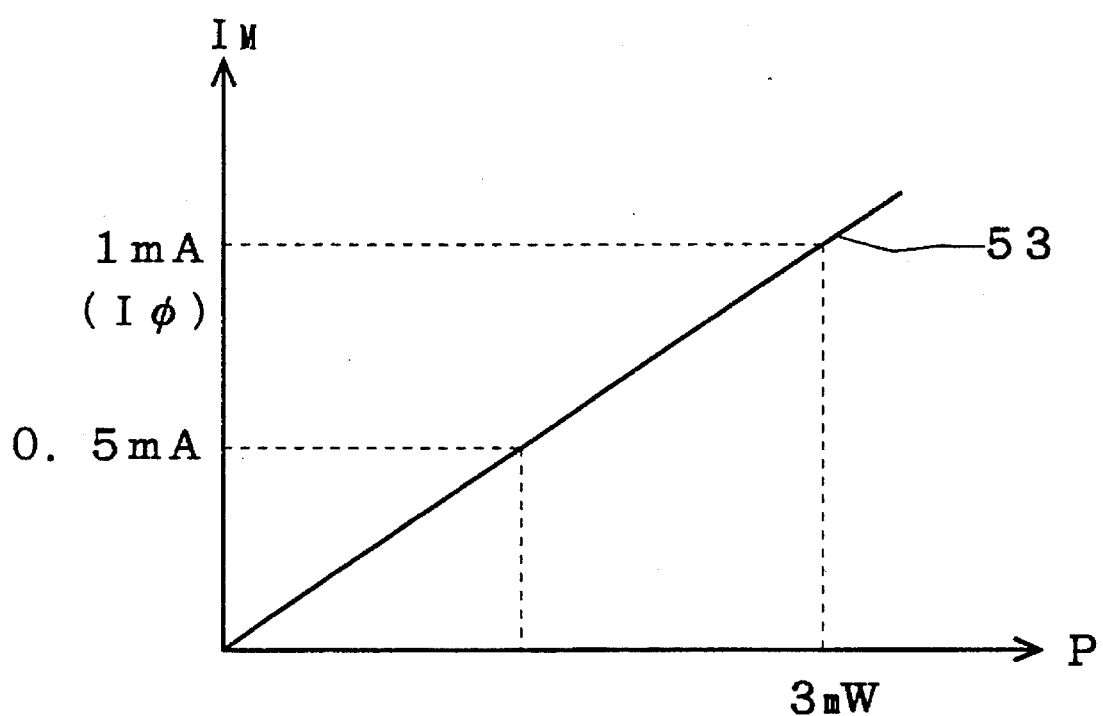
FIG. 4 is a graph for illustrating the art to which the present invention is applied.

Accordingly, the luminous power P is detected to automatically control the magnitude of the current $I_s$ on the basis of it in the APC. FIG. 4 is a graph showing an example of the relation between current $I_M$ flowed by the photodiode 42a (or 42b) and the luminous power P of the laser diode 41a (or 41b). The relation is hardly affected by the ambient temperature, and therefore it can be said that the current $I_M$ accurately detects the luminous power P even if the ambient temperature changes.

Assume here that the luminous power P should have two values, e.g., 3 mW as a value in the ON state and 0.3 mW as a value in the OFF state. During the OFF state, the current sources are controlled so that the bias current $I_b$ flows from the controllable current source 43b but the controllable current source 43a refrains from supplying current. As a result, the luminous power P is set at 0.3 mW. That is, where the current $I_M$ available from the photodiodes 42a and 42b has a value $I\phi$ (0.1 mA, for instance), the photodiodes 42a and 42b should always pass current $I\phi$. For example, if the current $I_M$ flowing from the photodiode 42 drops to 0.05 mA due to an increase in the ambient temperature, since the luminous power P of the laser diode 41b as well accordingly decreases, the control device 48 controls the controllable current source 43b so as to increase the current $I_M$.

To realize such control, the target potential $V\phi$ may be set to $I\phi \times R_M$, for example. Then, a determination can be made as to whether the luminous power P takes a constant value or not by comparing the output voltage $V_o$ which is equal to the input voltage $V_i$ transmitted by the voltage monitoring circuit 101 and the target potential $V\phi$ in the comparator 46b.

During the ON state, the current sources are controlled so that the bias current $I_b$ flows from the controllable current source 43b and the controllable current source 43a supplies the current $I_s$ to thereby set the luminous power at 3 mW. In other words, where the current $I_M$ available from the photodiodes 42a and 42b has a value $I\phi$ (0.1 mA, for instance), the photodiodes 42a and 42b should always pass current $I\phi$. For example, if the current $I_M$ flowing from the photodiode 42 drops to 0.5 mA due to an increase in the ambient temperature, since the luminous powers P of the laser diodes 41a and 41b as well accordingly decrease, the control device 48 controls the controllable current source 43a so as to increase the current $I_M$.

To control in this manner, it is necessary to control the value $R_M$ so that $I\phi \times R_M$ becomes equal to $V\phi$. If $R_M$ is controlled so that $I\phi \times R_M$ is equal to $V\phi$, by comparing the output potential $V_o$ which is equal to the input voltage $V_i$ supplied by the voltage monitoring circuit 100 with the desired potential $V\phi$ in the comparator 46a, it is possible to judge whether the luminous power P is at a constant value.

As the voltage monitoring circuit 100 is applied as described above, it is desired to quickly follow the change in the input voltage $V_i$. Accordingly, it is desirable to shorten the delay time as described in the conventional art, and the present invention is applied.

Figure 5:
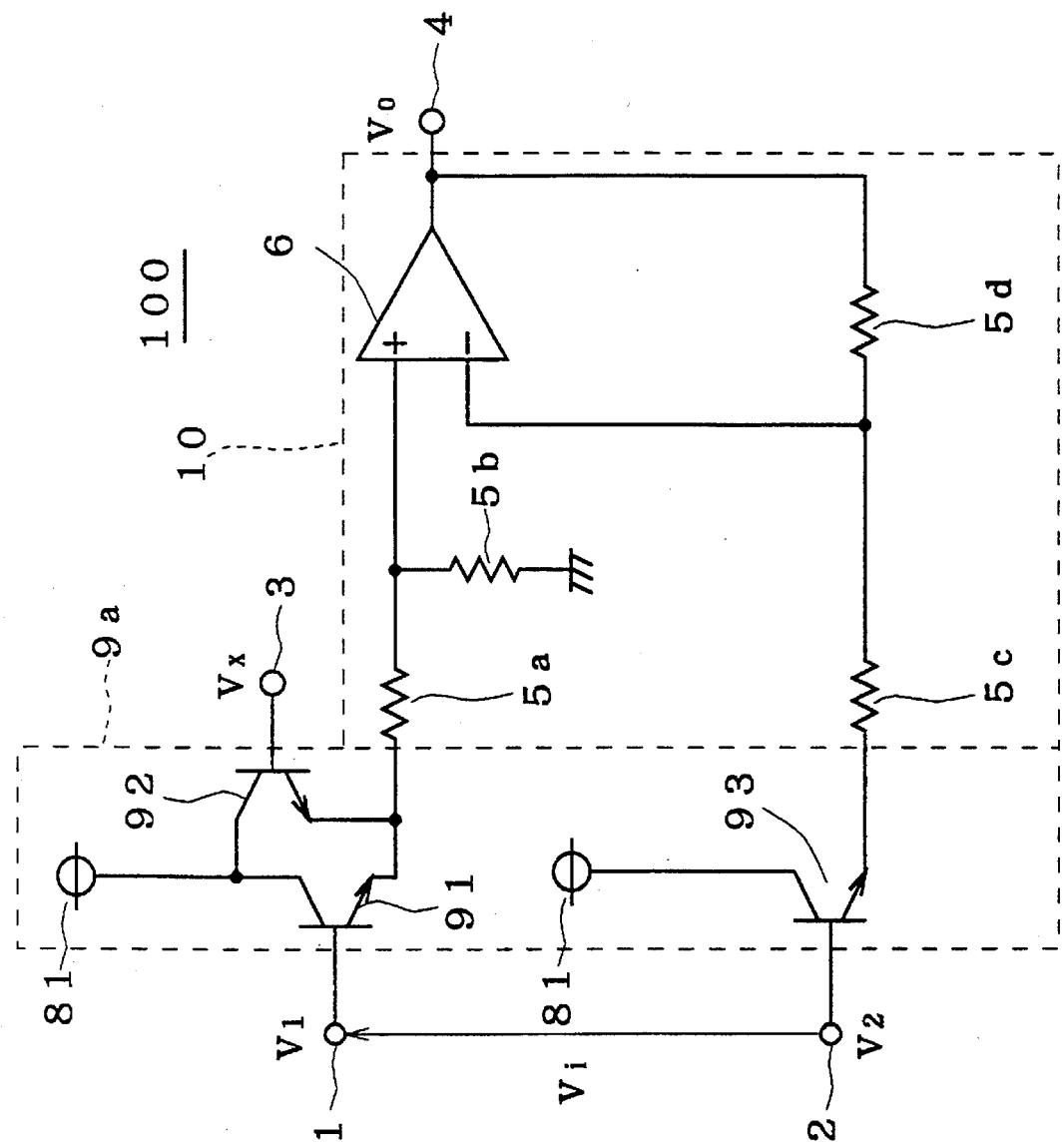
FIG. 5 is a circuit diagram showing the first preferred embodiment of the present invention.

B. First Preferred Embodiment;

FIG. 5 is a circuit diagram showing the structure of a voltage monitoring circuit 100 according to the first preferred embodiment of the present invention. The voltage monitoring circuit 100 is shown in FIGS. 1 and 2. A positive input terminal 1 and a negative input terminal 2 are connected to a voltage converting circuit 9a and input voltages $V_1$ and $V_2$ are applied to the terminals 1 and 2, respectively. Input voltage $V_i$ is equal to the difference between these potentials ($V_1-V_2$). A differential amplifier 10 is also connected to the voltage converting circuit 9a.

The differential amplifier 10 is composed of an operational amplifier 6 and resistors 5a, 5b, 5c and 5d. One ends of the resistors 5a and 5b are connected to the positive input end of the operational amplifier 6 and one ends of the resistors 5c and 5d are connected to the negative input end thereof, respectively. The other ends of the resistors 5a and 5c are connected to the voltage converting circuit 9a, the other end of the resistor 5b is grounded and the other end of the resistor 5d is connected to the output end of the operational amplifier 6.

The voltage converting circuit 9a includes NPN transistors 91, 92 and 93. The base of the transistor 91 is connected to the positive input terminal 1 and the base of the transistor 92 is connected to a reference potential input end 3 to which a reference potential $V_x$ is applied, respectively. The collectors of the transistors 91 and 92 are connected to a potential point 81 in common and the emitters thereof are connected to the other end of the resistor 5a in common. The base of the transistor 93 is connected to the negative input terminal 2, the collector is connected to a potential point 81 and the emitter is connected to the other end of the resistor 5c. The potential point 81 supplies potential which is higher than the potential ($V\phi+V_2$).

Figure 6A:
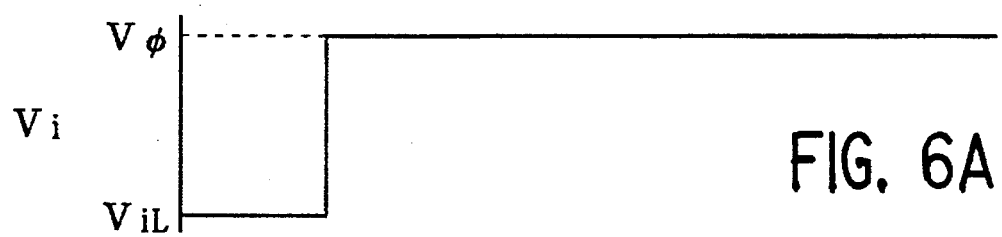
FIG. 6 is a graph for illustrating the first preferred embodiment of the present invention.
Figure 6B:
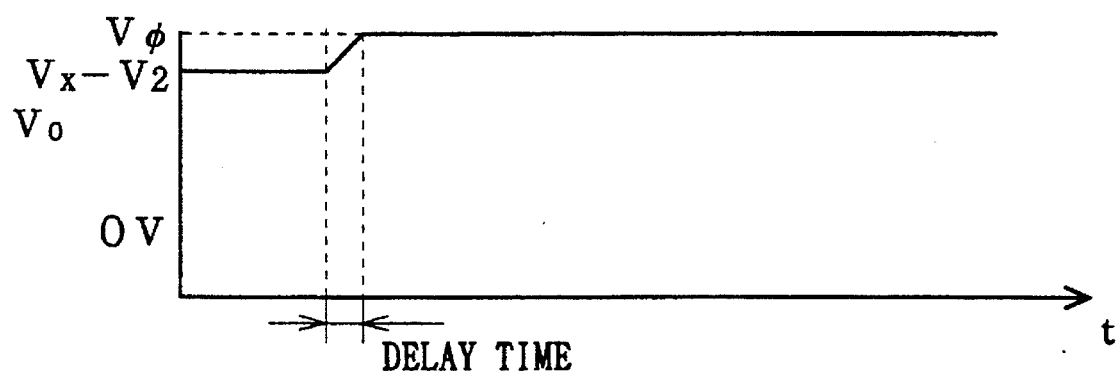

Now, the values of the resistances 5a, 5b, 5c and 5d are set all the same and the gain of the operational amplifier 6 is set sufficiently large. FIG. 6 is a graph showing a change in the output potential $V_o$ when the input voltage $V_i$ makes transition from a value $V_{iL}$ which is lower than the desired value $V\phi$ to the desired value $V\phi$, where it is assumed that the ground potential 0 volt is applied to the negative input terminal 2 for simplification. Now, the reference potential $V_x$ is set so that $(V_{iL}+V_2)<V_x<(V\phi+V_2)$.

While the input voltage $V_i$ stays at the value $V_{iL}$ (i.e., $V_1-V_2<V\phi$), the potential ($V_x-V_{be}$) is applied to the other end of the resistor 5a by the transistor 92. The voltage $V_{be}$ is base-emitter forward voltage which is common to the transistors 91, 92 and 93. On the other hand, the potential ($V_2-V_{be}$) is applied to the other end of the resistor 5c by the transistor 93. Accordingly, the voltage ($V_x \times V_2$) is inputted to the differential amplifier 10 and the output potential $V_o$ thereof becomes ($V_x-V_2$).

On the other hand, when the input voltage $V_i$ rapidly changes to the value $V\phi$ (i.e., $V_1$ reaches to $V_2+V\phi$), the potential ($V\phi+V_2-V_{be}$) is applied to the other end of the resistor 5a by the transistor 91. On the other hand, as the potential ($V_2-V_{be}$) is applied to the other end of the resistor 5c by the transistor 93, the voltage $V\phi$ is inputted to the differential amplifier 10. At this time, due to the through rate of the operational amplifier 6 in the differential amplifier 10 and the like, the output potential thereof becomes $V\phi$ being delayed from the rise of the input voltage $V_i$. That is to say, the output potential $V_o$ of the differential amplifier 10 becomes equal to the input voltage $V_i$ which is larger than the reference potential ($V_x-V_2$).

The delay time occurring here is a time required when the output of the differential amplifier 10 reach the potential $V\phi$ from the potential ($V_x-V_2$), where the potential difference to be transitted is smaller than that in the conventional case. Therefore the delay time occurring is also shortened than the conventional case.

Such effect is useful in the respect that the control of the control device 48 can be quick especially when the laser diodes 41a, 41b are turned on from the OFF state.

Figure 7:
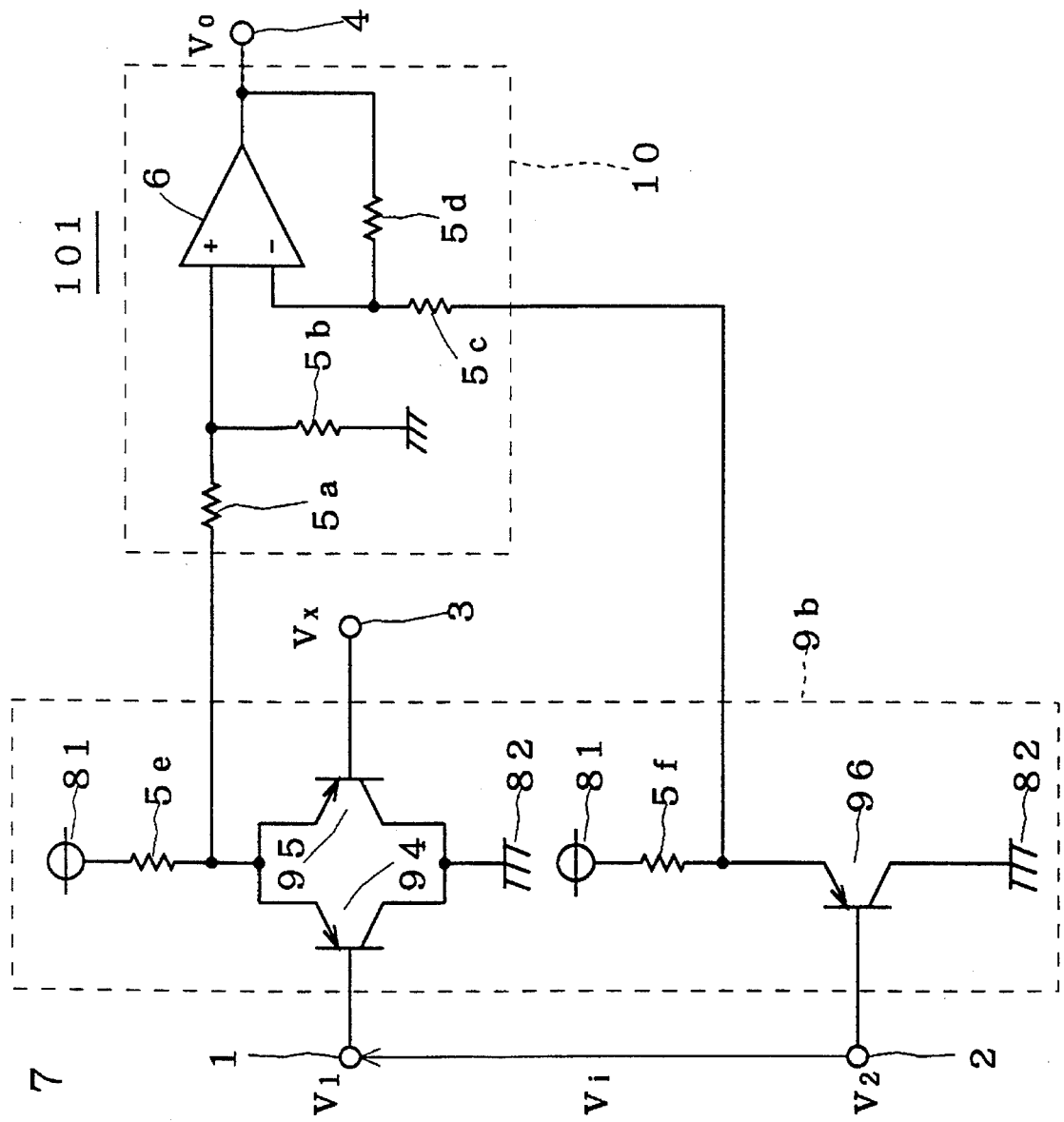
FIG. 7 is a circuit diagram showing the second preferred embodiment of the present invention.

C. Second Preferred Embodiment:

FIG. 7 is a circuit diagram showing the structure of a voltage monitoring circuit 101 according to the second preferred embodiment of the present invention. The voltage monitoring circuit 101 is shown in FIG. 1 and 2. The voltage monitoring circuit 101 has the structure in which the voltage converting circuit 9a in the voltage monitoring circuit 100 of the first preferred embodiment is replaced by a voltage converting circuit 9b. Assuming that input voltages $V_1$ and $V_2$ ($V_1-V_2=V_i$) are applied to the terminals 1 and 2, respectively, as in the first preferred embodiment, a description will be made on the second preferred embodiment.

The voltage converting circuit 9b includes PNP transistors 94, 95 and 96. The base of the transistor 94 is connected to the positive input terminal 1 and the base of the transistor 95 is connected to the reference potential input end 3 to which the reference potential $V_x$ is applied, respectively. The collectors of the transistors 94 and 95 are connected to a potential point 82 in common, and the emitters are connected to the other end of the resistor 5a in common. Also, the base of the transistor 96 is connected to the negative input terminal 2, the collector is connected to the potential point 82 and the emitter is connected to the other end of the resistor 5c. The potential point 82 supplies potential which is lower than the potential $(V\phi+V_2)$. The emitters of the transistors 94 and 95 and the emitter of the transistor 96 are connected to the potential point 81 through the resistors 5e and 5f, respectively.

Figure 8A:
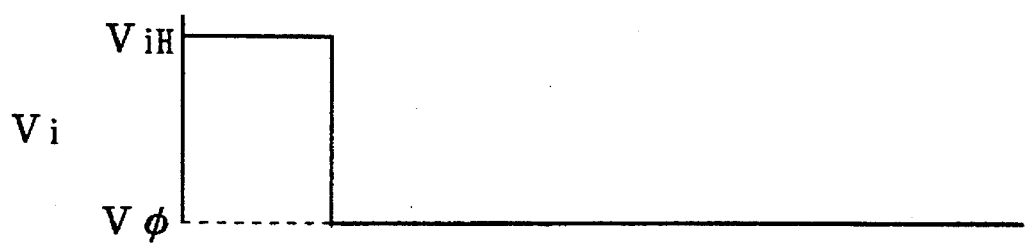
FIG. 8 is a graph for illustrating the second preferred embodiment of the present invention.
Figure 8B:
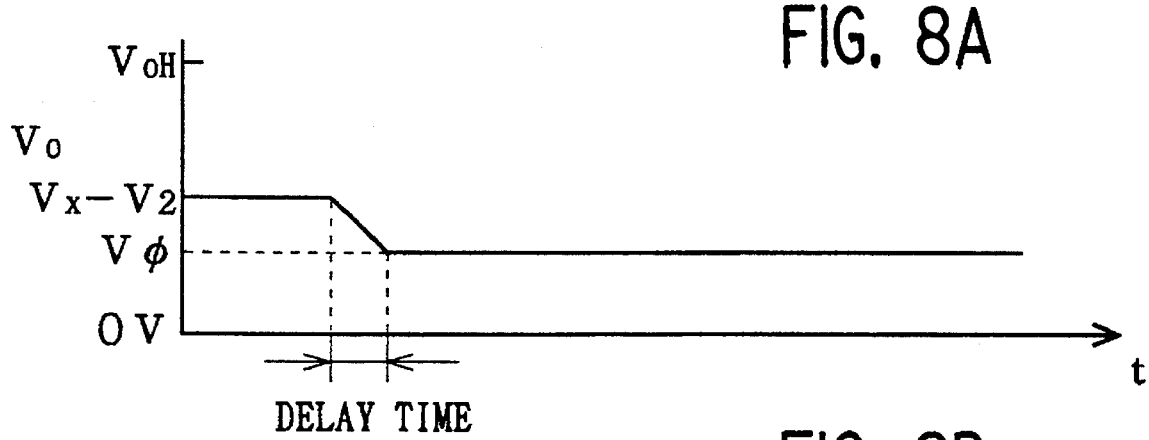

FIG. 8 is a graph showing the change in the output potential $V_o$ when the input voltage $V_i$ changes to the desired value $V\phi$ from a value $V_{iH}$ which is higher than the desired value $V\phi$, where the reference potential $V_x$ is set so that $(V\phi+V_2)<V_x<(V_{iH}+V_2)$.

While the input voltage $V_i$ stays at the value $V_{iH}$ (i.e., $V_1-V_2>V\phi$, the potential $(V_x+V_{be})$ is applied to the other end of the resistor 5a by the transistor 95. Now, the voltage $V_{be}$ is the base-emitter forward voltage which is common to the transistors 94, 95 and 96. On the other hand, the potential $(V_{be}+V_2)$ is applied to the other end of the resistor 5c by the transistor 96. Accordingly, the voltage $(V_x-V_2)$ is inputted to the differential amplifier 10, of which output potential becomes $(V_x-V_2)$.

On the other hand, when the input voltage $V_i$ rapidly changes to the value $V\phi$ (i.e., $V_1=V_2+V\phi$), the potential $(V\phi+V_2+V_{be})$ is applied to the other end of the resistor 5a by the transistor 94. On the other hand, as the potential $(V_{be}+V_2)$ is applied to the other end of the resistor 5c by the transistor 96, the voltage $V\phi$ is inputted to the differential amplifier 10. At this time the output potential of the differential amplifier 10 becomes the potential $V\phi$ being delayed from the rise of the input voltage $V_i$. That is to say, the output potential of the differential amplifier 10 becomes equal to the input voltage $V_i$ which is smaller than the reference potential $(V_x-V_2)$.

The delay time occurring this time is also a time which the output of the differential amplifier 10 requires to reach the potential $V\phi$ from the potential. $(V_x-V_2)$ as in the first preferred embodiment, where the potential difference to be changed is smaller than that in the conventional case. Accordingly, the delay time occurring is also shortened than the conventional case. This is particularly advantageous in that the control device 48 operates quickly when the laser diodes 41a and 41b switch from the ON state to the OFF state.

Figure 9:
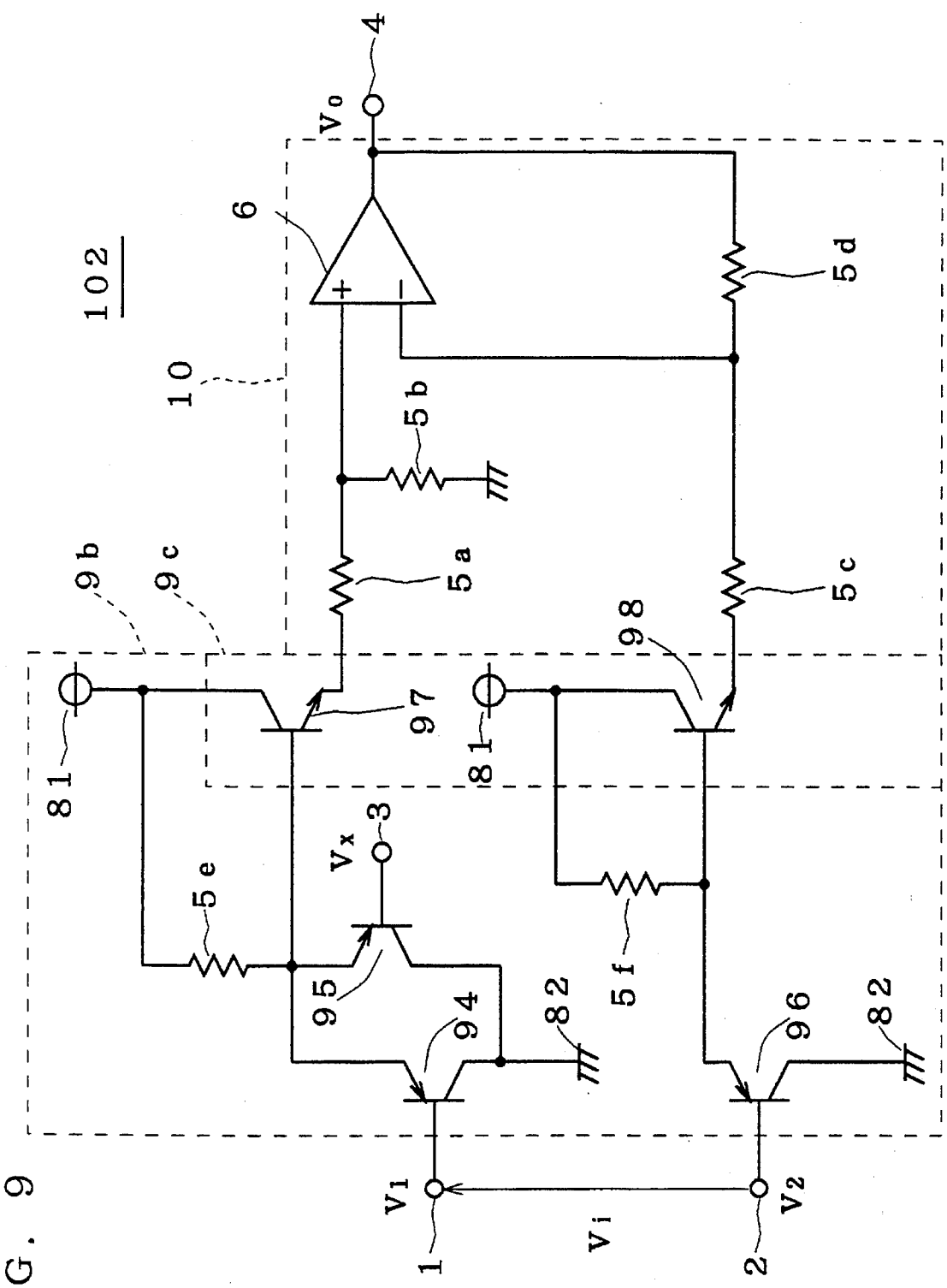
FIG. 9 is a circuit diagram showing the third preferred embodiment of the present invention.
Figure 10:
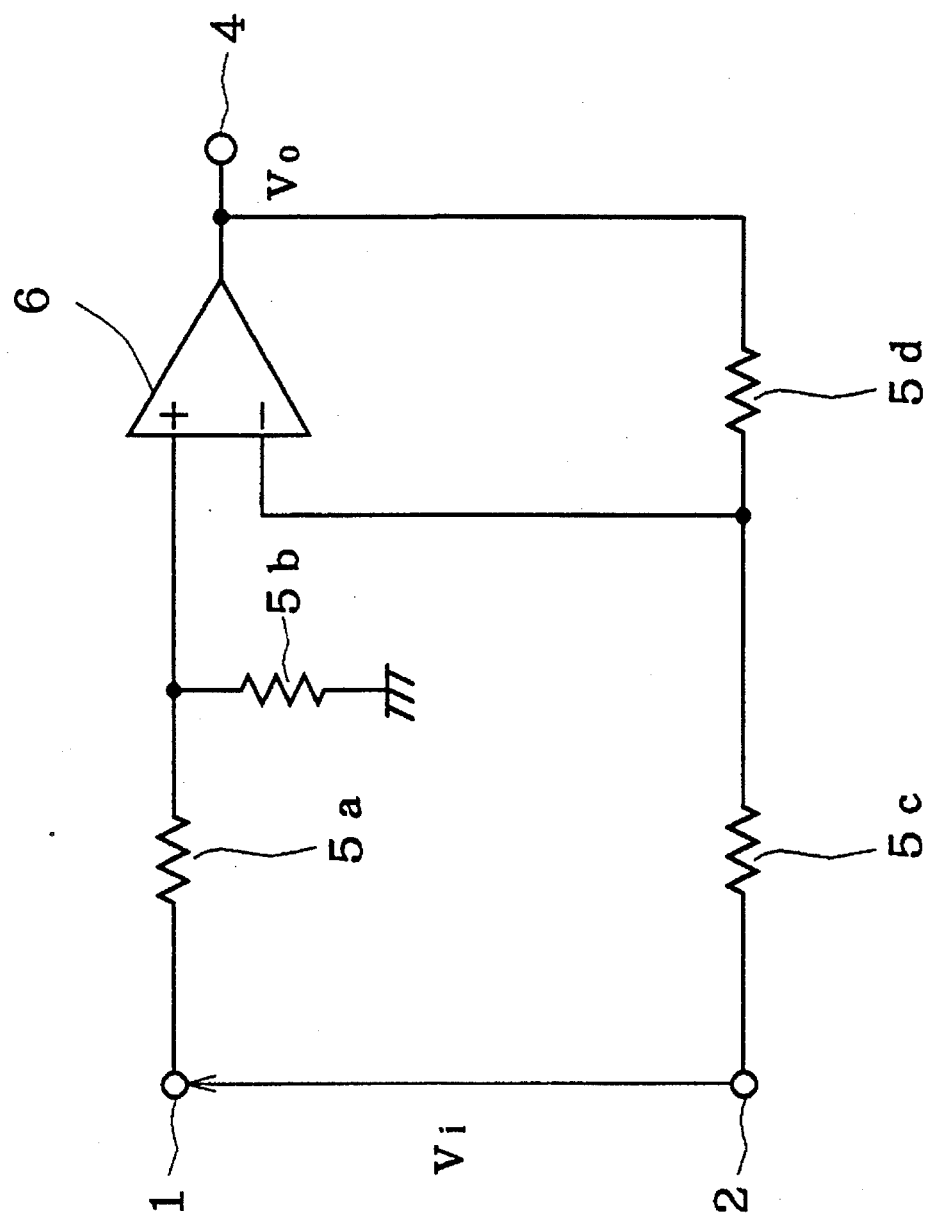
FIG. 10 is a circuit diagram showing the conventional art.
Figures 12A, 12B:
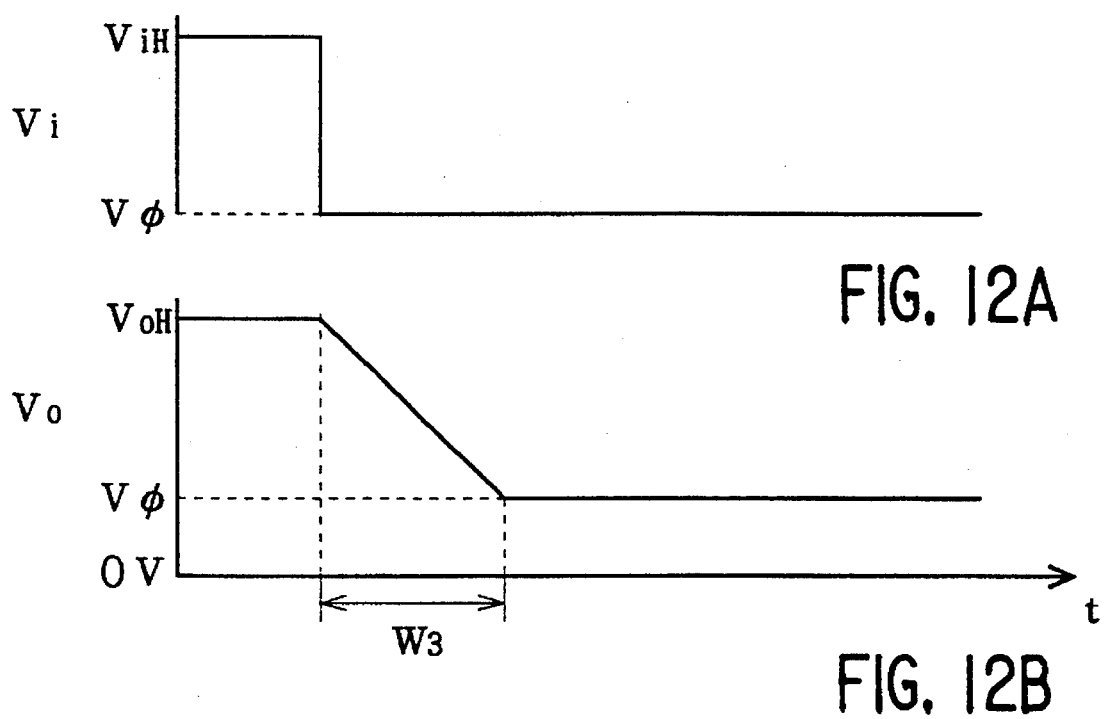
FIG. 12 is a graph for illustrating the conventional art.

D. Third Preferred Embodiment;

FIG. 9 is a circuit diagram showing the structure of a voltage monitoring circuit 102 according to the third preferred embodiment of the preferred embodiment. The voltage monitoring circuit 102 has the structure in which an impedance converting circuit 9c is added between the voltage converting circuit 9b and the differential amplifier circuit 10 in the voltage monitoring circuit 101 of the second preferred embodiment.

Generally, the current amplification factor β of the PNP transistor is smaller than that of the NPN transistor. In the voltage monitoring circuit 101 shown in the second preferred embodiment, the current flowing to the positive input terminal 1 and the negative input terminal 2 is therefore larger than that in the voltage monitoring circuit 100 shown in the first preferred embodiment. Thus, the measurement of the current $I_M$, that is, the measurement of the luminous power P may not accurately performed. To make an improvement in this respect, the impedance converting circuit 9c is provided.

The impedance converting circuit 9c has NPN transistors 97 and 98. The base of the transistor 97 is connected to the emitters of the transistors 94 and 95 in the voltage converting circuit 9b in common. The collector and the emitter of the transistor 97 are connected to the potential point 81 and the other end of the resistor 5a, respectively. The base, the collector and the emitter of the transistor 98 are connected to the emitter of the transistor 96, the potential point 81 and the other end of the resistor 5c, respectively.

With such a structure, the current flowing to the transistors 94, 95 and 96 in the voltage converting circuit 9b is reduced, and therefore the input impedance of the voltage monitoring circuit 102 becomes larger than that of the voltage monitoring circuit 101, resulting in an improvement in the accuracy of the measurement of the current $I_M$. As a matter of course, the voltage monitoring circuit 102 shown in the third preferred embodiment can be substituted for the voltage monitoring circuit 101 in the APC shown in FIG. 1.

While the invention has been shown and described in detail, the foregoing description is in all aspects illustrative and not restrictive. It is therefore understood that numerous modifications and variations can be devised without departing from the scope of the invention.

What is claimed is:

1. A voltage monitoring circuit comprising:
   (a) first and second input terminals between which an input voltage which changes to a desired value is applied and an output terminal;
   (b) a differential amplifier having an output end connected to said output terminal and first and second input ends, and
   (c) voltage converting means having,
      (c-1) first and second input ends respectively connected to said first and second input terminals for receiving first and second potentials representing said input voltage,
      (c-2) a reference potential input end to which a reference potential set in the vicinity of said desired value is applied, and
      (c-3) first and second output ends connected to said first and second input ends of said differential amplifier, respectively,
   for applying said input voltage between said first output end and said second output end when said input voltage is closer to said desired value than said reference potential, and
   applying a potential difference between said reference potential and said second potential between said first output end and said second output end when said input voltage is farther from said desired value than said reference potential;
   wherein a result of monitoring a change in said input voltage is provided to said output terminal.

2. The voltage monitoring circuit according to claim 1, wherein said differential amplifier comprises;
   (b-1) an operational amplifier having an output end connected to said output terminal, a positive input end, and a negative input end,
   (b-2) a first resistor connected between said first input end of said differential amplifier and said positive input end of said operational amplifier,
   (b-3) a second resistor connected between said second input end of said differential amplifier and said negative input end of said operational amplifier, (b-4) a third resistor connected between said positive input end of said operational amplifier and ground, (b-5) a fourth resistor for connecting said negative input end and said output end of said operational amplifier.

3. The voltage monitoring circuit according to claim 2, wherein values of said first through fourth resistors are equal to one another.

4. The voltage monitoring circuit according to claim 1, wherein said reference potential is lower than said desired value.

5. The voltage monitoring circuit according to claim 1, wherein said reference potential is higher than said desired value.

6. The voltage monitoring circuit according to claim 1, wherein said voltage converting means further comprises;

(c-4) a first converting portion for level shifting either one of said first potential and said reference potential by a predetermined amount and applying it to said first output end, and (c-5) a second converting portion for level shifting said second potential by said predetermined amount and applying it to said second output end.

7. The voltage monitoring circuit according to claim 6, wherein said first converting portion comprises;

(c-4-1) a first transistor having a control electrode to which said first potential is applied, a first current electrode connected to predetermined potential and a second current electrode connected to said first output end of said converting means, and (c-4-2) a second transistor having a control electrode to which said reference potential is applied, a first current electrode connected to said predetermined potential and a second current electrode connected to said first output end of said converting means.

8. The voltage monitoring circuit according to claim 7, wherein said second converting portion further comprises;

(c-5-1) a third transistor having a control electrode to which said second potential is applied, a first current electrode connected to said predetermined potential and a second current electrode connected to said second output end of said converting means.

9. The voltage monitoring circuit according to claim 8, wherein said reference potential is lower than said desired value, and said first through third transistors are all NPN-type bipolar transistors.

10. The voltage monitoring circuit according to claim 8, wherein said reference potential is higher than said desired value, and said first through third transistors are all PNP-type bipolar transistors.

11. The voltage monitoring circuit according to claim 10, wherein impedance converting means is further provided between said voltage converting means and said differential amplifier.

* * * * *